United States Patent [19]

Dahlberg

[11] 4,326,188

[45] Apr. 20, 1982

[54] MAGNETICALLY CONTROLLABLE VARIABLE RESISTOR

[75] Inventor: Reinhard Dahlberg, Flein, Fed. Rep. of Germany

[73] Assignee: Licentia Patent-Verwaltungs-G.m.b.H., Frankfurt am Main, Fed. Rep. of Germany

[21] Appl. No.: 163,827

[22] Filed: Jun. 27, 1980

[30] Foreign Application Priority Data

Jul. 3, 1979 [DE] Fed. Rep. of Germany ....... 2926786

[51] Int. Cl.³ .............................................. H01L 43/08
[52] U.S. Cl. .................................. 338/32 S; 335/216
[58] Field of Search ...................... 338/32 S, 103, 116; 335/216; 367/212, 245, 277; 329/200; 357/27

[56] References Cited

U.S. PATENT DOCUMENTS

| | | | |
|---|---|---|---|
| 2,938,160 | 5/1960 | Steele | 338/32 S X |
| 3,296,459 | 4/1967 | Frankel | 338/32 S X |
| 3,324,436 | 6/1967 | Mueller | 338/32 S |
| 3,706,064 | 12/1972 | Dynes et al. | 338/32 S |

FOREIGN PATENT DOCUMENTS 1490539 6/1969 Fed. Rep. of Germany .

*Primary Examiner*—C. L. Albritton
*Attorney, Agent, or Firm*—Spencer & Kaye

[57] ABSTRACT

A magnetically controllable variable resistor comprises two separate elements between which a layer applied to at least one of the elements and a material with a magnetically variable specific resistance is sandwiched under mechanical pressure at least one of the elements having at least three tapering structures on its surface adjacent to the layer so that pressure contacts are formed in the region of these structures.

10 Claims, 5 Drawing Figures

MAGNETICALLY CONTROLLABLE VARIABLE RESISTOR

BACKGROUND OF THE INVENTION

The invention relates to as electrical resister the value of which is controllable by a magnetic field.

It is known that a bismuth spiral in a magnetic field of $\sim 10^4$ Oersted for example has a resistance increased by approximately 50%. In addition, semiconductors such as InSb which have a high charge carrier mobility exhibit an increase in their resistance in high magnetic fields in excess of the reduction in mobility. The effect of magnetic fields on superconductors is especially great. If the magnetic field reaches a critical value, superconductivity disappears. This effect is utilized in super conducting switches. In general, however, fields of the order of magnitude of kilo-Oersteds are required in order to produce noticeable effects.

SUMMARY OF THE INVENTION

It is an object under the invention to produce a magnetically controllable variable resister which has a large sensitivity to a magnetic field.

According to the invention, there is provided a magnetically controllable variable resistor comprising a first element having at least three tapering elevations on one surface thereof, a second element having a surface cooperating with said one surface of said first element and a layer of a material with a specific electrical resistance which is variable under the influence of a magnetic field, the layer of material being applied to at least one of said elements positioned between said first and second elements, and being connected with said first and second elements under mechanical pressure, to provide pressure contacts in the region of said tapering elevations.

Further according to the invention, a magnetically controllable variable resistor comprising two separate ferro or ferrimagnetic elements at least one element having a structure with at least three tapering elevations; a layer of a material of which the specific electrical resistance varies in a magnetic field applied to at least one of said elements; both elements being joined together under mechanical pressure so that pressure contacts are formed at the areas of contact in the region of the tapering elevations by means of a layer which is sensitive to the magnetic field; and an electrical field and a magnetic field being present between the two elements.

BRIEF DESCRIPTION OF THE DRAWINGS

The invention will now be described in greater detail, by way of example, with reference to the drawings, in which.

DESCRIPTION OF THE PREFERRED EMBODIMENTS

Figure 1:
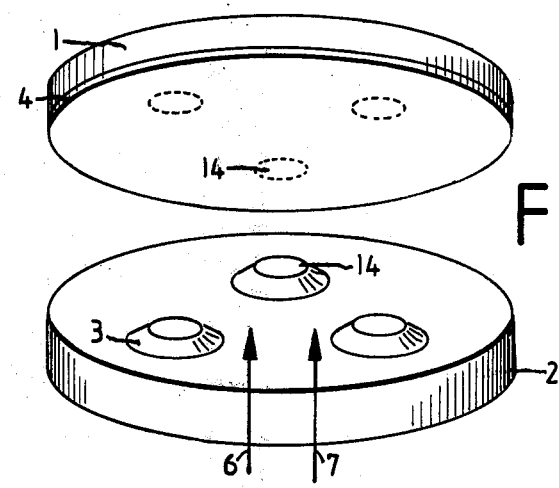
FIG. 1 is a perspective view of two discs for producing a magnetically controllable resister in accordance with a first embodiment of the invention.

Basically the invention proposed to provide two separate elements made from ferro- or ferrimagnetic material; at least one element having a structure with at least three tapering elevations a layer of a material, whose specific electrical resistance changes in a magnetic field is applied to at least one element and the two elements are joined together under mechanical pressure to form pressure contacts over the layer which is sensitive to the magnetic field at the areas of contact in the region of the tapering elevations. An electrical field and a magnetic field are provided between the two plates.

The tapering elevations are generally equal in area. The three-point configuration produces mechanical stability.

A preferred embodiment of the magnetically controllable resistor is so constructed that both elements have the shape of plates or discs and comprise ferro- or ferri material. The plates or discs have a structure with parallel ridges tapering towards a narrow edge at their outer face on one of the main two sides of the plates or discs. They are rotated with respect to each other in relation to the ridge structures in the plane of the plates or discs and are joined together under pressure at their structured surfaces. The crossing ridges form with their edges pressure contacts small in terms of area, on both sides of the layer which is sensitive to the magnetic field. The principle of crossing parallel ridges has already been described in German Offenlegungsschrift No. P 25 47 262. The manufacture of a magnetically controllable resistor according to this principle is not mentioned there however.

The magnetic induction flow up to the layer which is sensitive to the magnetic field is concentrated by the tapering elevations comprising ferroelectrical material. The elevations act like the conical pole shoes of a magnet. The layer which is sensitive to the magnetic field acts like a thin air gap between the pole shoes of a magnet.

If an elevation made from ferroelectrical material tapers to an area of $5 \cdot 10^{-4} \times 5 \cdot 10^{-4}$ cm from $1 \cdot 10^{-2} \times 1 \cdot 10^{-2}$ cm, then the magnetic field lines are theoretically compacted by a factor of $10^3$. In practice, this factor is substantially smaller because of the dependence of the magnetic field on the permeability of the ferromagnetic material. However, in this way field strengths may be produced in the layer which is sensitive to the magnetic field, which are greater by several orders of magnitude then the external manetic field.

Furthermore, the magnetic resistor of the invention has the advantage that the layers which are sensitive to the magnetic field are cooled extremely well. These layers are located as "impurity layers" in contact resistor. The permissible power densities P=[watts/cm 2] rise, as is known in proportion to 1/2D, where 2D is the diameter of the contact.

Therefore, magnetically controllable resistors for large electrical output losses may be manufactured, in accordance with the invention, without impermissible heating of the layer which is sensitive to the magnetic field.

The plates or discs may comprise a ferro- or ferrimagnetic material having a good electrical conductivity such as an alloy of iron and nickel or a glass-type magnetic metal alloy. The plates or discs may comprise ferro- or ferrimagnetic material however which is a poor conductor or even an insulator for very high frequencies such as mixtures of oxides for example, In this case the plates or discs including the structures of the magnetically controllable resistor of the invention may be coated in a layer of a metal which is a good electrical conductor, such as Ag, Cu, Al inter alia. A soft ferro- or ferrimagnetic material with a high saturation field strength may be used as the material for the plates or discs.

Bismuth, tellurium, III/V compounds or II/VI compounds inter alia may be used as the material for the resistance layers which depend on the magnetic field.

Superconductive material may also be used as the material for the layers having the resistance which is dependent on the magnetic field, if the magnetically controllable resistor is operated at low temperature.

The magnetically controllable resistor is suitable, with appropriate magnetic control field for amplifying electrical output up to fairly high frequencies. It is also capable of being developed as an oscillator by selecting suitable ferro- or ferrimagnetic materials, up to the very highest frequencies. It may also be used as a switch or as a superconducting switch. Josephson point contact junctions and magnetically controllable resistors may be developed as the magnetically controlled Josephson components by means of superconducting layers on both elements.

Several magnetically controllable resistors may be connected electrically in parallel and in series.

Referring now to the drawings, five embodiments of the invention will now be described.

Embodiment 1 describes the principle of the magnetically controllable resistor having a layer of bismuth.

Embodiment 2 described a magnetically controllable resistor having parallel ridges as an amplifier.

Embodiment 3 describes an oscillator which operates with a superconducting layer at low temperature.

Embodiment 4 describes a superconducting circuit breaker.

Embodiment 5 described a magnetically controlled Josephson component.

EMBODIMENT 1

Figure 2:
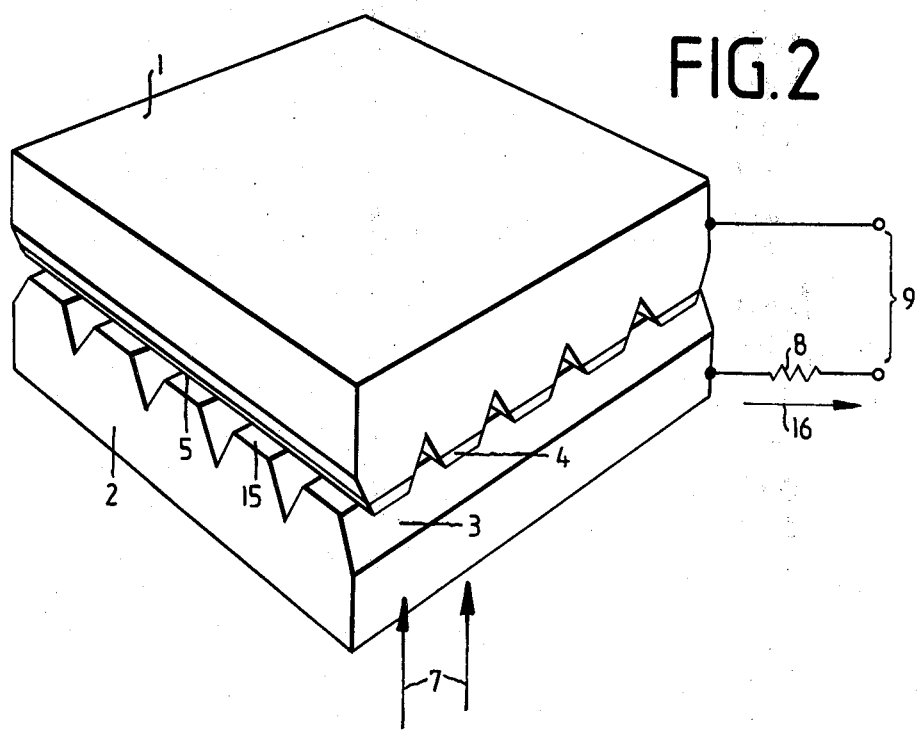
FIG. 2 is a perspective view of a second embodiment of a magnetically controllable resister in accordance with the invention.

In FIGS. 1, 1 and 2 are discs made of iron. The disc 2 has three iron frusto-conical elevations 3, which taper towards the outer bearing surfaces 14. The ratio between the areas of the base and the bearing surface 14 of the elevations is 100:1. The iron disc 1 is coated on its underside with a bismuth layer 4 which is approximately $5 \cdot 10^{-3}$ cm thick. The discs 1 and 2 are placed together under pressure so that the bearing surfaces 14 of the elevations 3 form parallel connected pressure contacts with the bismuth layer 4 on the disc 1. When applying a small external magnetic field 7, a magnetic field is formed in the bismuth layer 4 (acting like an air gap) as a result of the permeability of the iron and of the pole shoe effect of the elevations 3, this magnetic field being of orders of magnitude greater than the external magnetic field 7. 6 is an electrical field.

EMBODIMENT 2

In FIG. 2, 1 and 2 are plates made from a soft ferromagnetic glass-like alloy with a saturation induction of 24 kilo Gauss. Both plates have a structure on one of either surfaces with parallel ridges 3 tapering to one edges 15 which has a width of $1 \cdot 10^{-3}$ cm., these ridges being separated from each other by corresponding grooves. The plate 1 had an n-InSb layer 4 vapour-deposited thereon having a thickness of $1 \cdot 10^{-3}$ cm and a specific resistance of approximately $3 \cdot 10^{-3} \Omega$ cm before producing the structure comprising the ridges 3 on the surface provided for the ridge structure, this layer 4 being removed again during manufacture in the region of the grooves lying between the ridges. By placing plates 1 and 2 on top of each other with their structures surfaces rotated with respect to each other by 90° in the plane of the plates 25, pressure contacts 5 are formed each having an area of $1 \cdot 10^{-6}$ cm$^2$ at the n-InSb layer 4. The total resistance amounts to approximately 0.2 ohm. A d.c. voltage 9 is applied between the two ferromagnetic plates 1 and 2 via the resistor 8 which is attached to the plate 2. A maximum magnetic alternating field of over 20000 Oersted is formed in the n-InSb layers 4 by means of an external magnetic alternating field 7 having a maximum of approximately 1.5 Oersted. As a result the electrical resistance of the n-InSb layers changes with the fluctuation frequency of the magnetic alternating field 7 so that the electrical current 16 through the arrangement is modulated by the magnetic alternating field 7.

EMBODIMENT 3

Figure 3:
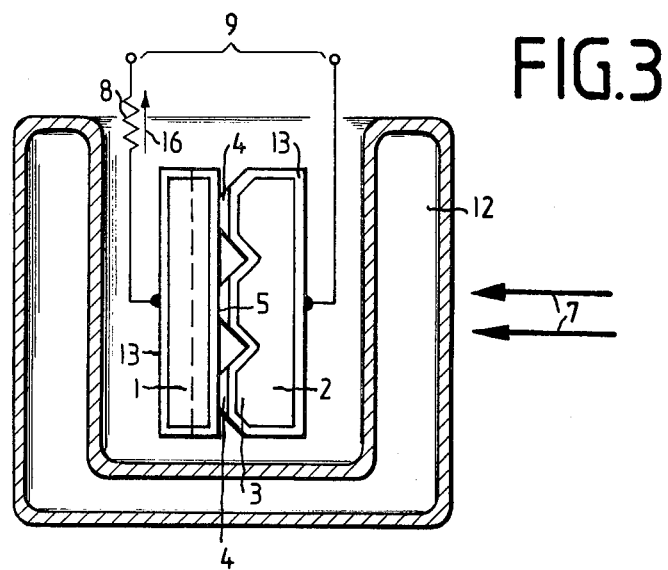
FIG. 3 is a sectional view of an oscillator forming a third embodiment of the invention.

In FIG. 3, 1 and 2 are soft magnetic ferrite plates or discs having an electrical resistivity of approximately $10^{13} \Omega$ cm. A structure of parallel ridges 3 tapering to an edge 15 (FIG. 2) of $2 \cdot 10^{-4}$ cm in width has been produced on one side of each plate. Then both plates 1 and 2 are coated with a layer of gold 13 having a thickness of $5 \cdot 10^{-5}$ cm. A layer of lead 4 with a thickness of $1.5 \cdot 10^{-4}$ cm was vapour-deposited on to the edges 15 of the plate 2 over the layer of gold 13. Then both plates 1 and 2 were put together under pressure with their structured surfaces facing so that the ridges 3 of both plates cross. Thus, in the embodiment shown nine electrically parallel connected contacts 5 having an area of $4 \cdot 10^{-8}$ cm$^2$ in each case are formed at the lead 4 for every three ridges 3,. A d.c. voltage source 9 is connected to the gold layers 13 of the two plates 1 and 2, via a series resistor 8 to the plate 1, which are located in the low-temperature cooling vessel 12 at the temperature of liquid helium. The lead layers 4 are superconductive so that a current flows, limited by the series resistor 8 having the value $4 \cdot 10^{-2}$ ohms. During each half-wave, a sinusoidal magnetic alternating field 7 exceeds the critical magnetic field strength the lead layers 4 once and falls below the critical magnetic field strength once. As a result square-wave current pulse 16 flow through the resistor 8.

EMBODIMENT 4

Figure 4:
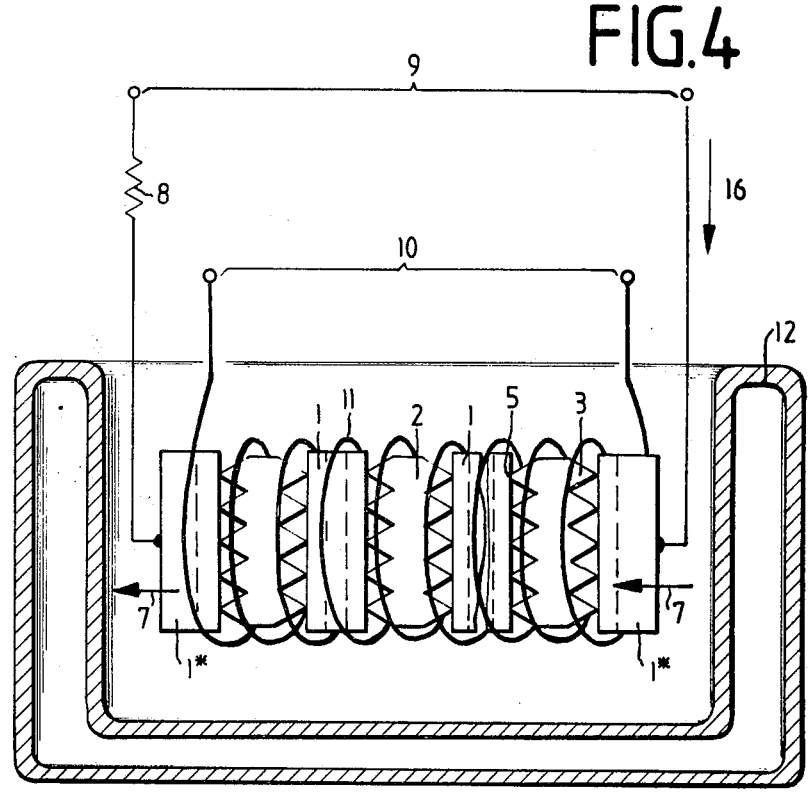
FIG. 4 is a diagrammatic view of a superconducting circuit breaker in accordance with the invention.

In FIG. 4, 1 and 2 are iron plates having a thickness of $2.5 \cdot 10^{-2}$ cm which bear a structure of parallel ridges 3 on both of their surfaces, the said ridges tapering to edges 15 having a width of approximately $1 \cdot 10^{-4}$ cm. The end plates 1* are provided with a ridge structure on one side only, namely on the inwardly facing surface. The iron plates 1, 1* and 2 are coated completely with a layer of tin, not shown, having a thickness of $1 \cdot 10^{-4}$ cm and are placed together under pressure so that the ridges on both facing surfaces of two adjacent plates respectively. At each crossing junction from one plate 1 to one plate 2 is formed by tin contacts 5 having an area in each case of $1 \cdot 10^{-8}$ cm$^2$. There are 25 crossing contacts between each pair of plates, 400 plates 1 for example are assembled alternatively with 400 plates 2 and are retained under pressure. The cascade of plates 1 and 2 then has an electrical resistance of approximately 6 ohms, which disappears if the cascade is located in a low-temperature cooling vessel 12 at the temperature of liquid helium. A d.c. voltage 9 of 2.1 volts is supplied to the cascade via the resistor 8 connected to one outer plate 1* the said resistor having a value of $5 \cdot 10^{-4}$ ohms. A magnetic coil surrounding the cascade may be energized by the control voltage source 10. The magnetic field 7 is amplified in the tin contacts, which act like "air gaps", so that the critical magnetic field strength of the tin is exceeded. Thus the current 16 having a value of approximately 350 mA flowing through the cascade when the magnetic field 7 is present may be switched to 4.2 kiloamperes without the magnetic field 7 or vice versa.

EMBODIMENT 5

Figure 5:
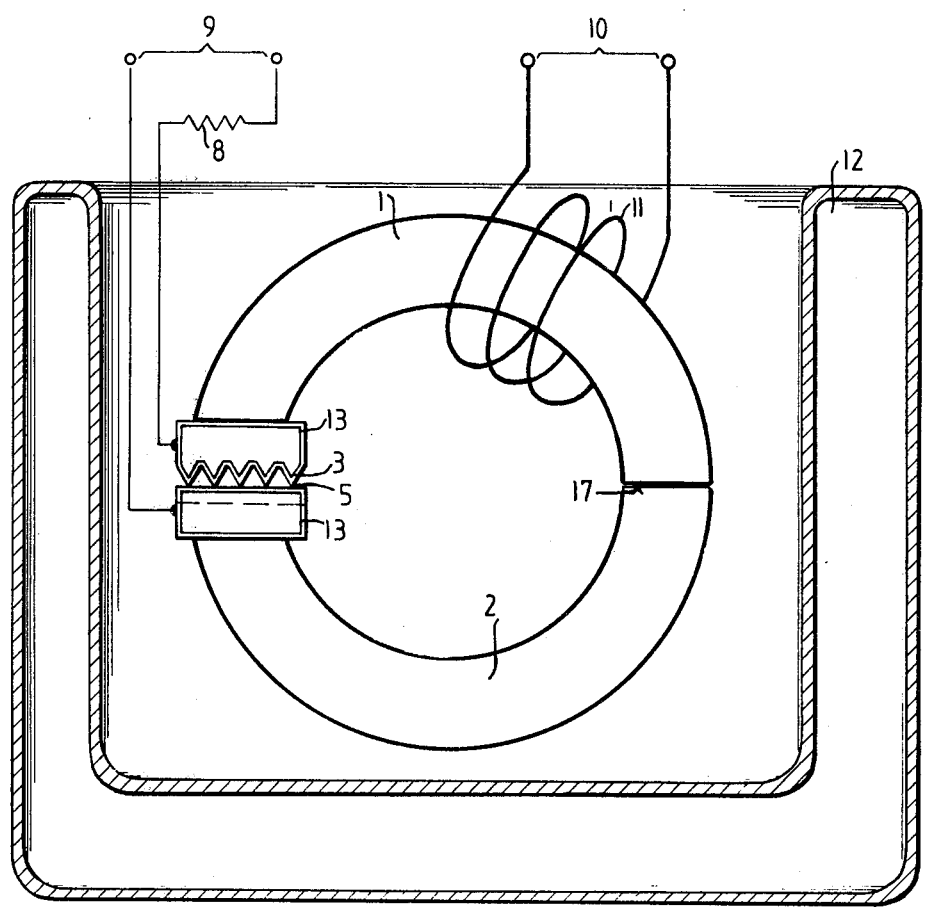
FIG. 5 shows a magnetically controlled Josephson component in accordance with the invention

In FIGS. 5, 1 and 2 are two ring halves of high frequency ferrite material. The two ring halves 1 and 2 each have one smooth separating surface 17 and one separating surfaces having a structure with parallel ridges 3. The ridges 3 taper to curve radii of $5 \cdot 10^{-5}$ cm. The ridges 3 on the ring half 1 are rotated by 90° with respect to the ridges 3 on the ring half 2 in the plane of contact when the ring halves are assembled to form a complete ring. The structures with the ridges 3 were coated with a gold layer 13 having a thickness of $2 \cdot 10^{-5}$ cm. as indicated in FIG. 5. A layer of niobium nitride not shown and having a thickness of $5 \cdot 10^{-5}$ cm in each case was applied to the ridges 3 in both ring halves 1 and 2 by the gold layer 13 in order to constitute a superconductor in a manner known per se. Both ring halves 1 and 2 were assembled so that the crossing ridges 3 forms a total of twenty-five electrically parallel connected Josephson point contact junctions 5. The ring assembled from ring halves 1 and 2 is located in the low-temperature vessel 12 at the temperature of liquid helium. A d.c. voltage 9 is applied via the series resistor 8 across the gold layers 13 on the two ridge structures and thus is applied to the Josephson junction 5. The magnetic control of the Josephson junctions 5 is effected in a closed magnetic circuit of the two assembled ring halves 1 and 2 via a coil 11 encircling the ring and the control voltage 10 which may be applied to the coil.

It will be understood that the above description of the present invention is susceptible to various modification changes and adaptions.

What is claimed is:

1. A magnetically controllable variable resistor comprising two separate elements composed of a material selected from the group consisting of ferromagnetic and ferrimagnetic materials at least one element having a structure with at least three tapering elevations; a magnetic field sensitive layer of a material of which the specific electrical resistance varies in a magnetic field applied to at least one of said elements; both elements being joined together under mechanical pressure so that pressure contacts are formed at the areas of contact in the region of the tapering elevations by means of said layer; and an electrical field and a magnetic field being present between the two elements.

2. A resistor as defined in claim 1, where each said element comprises a body having a form selected from the group consisting of plates and discs and having its said structure on one of its two main surfaces with parallel ridges tapering towards a narrow edge, and said elements are assembled under pressure with their structured surfaces facing and their ridges rotated relative to each other so that the ridges of one structure cross and touch the ridges on the other structure to form small areas of pressure contact on both sides of said magnetic field sensitive layer.

3. A magnetically controllable resistor as defined in claim 1 where said two elements comprise ring halves assembled to form closed ring, each ring having at least one structure of parallel and tapering ridges on one separating face; arranged to touch and cross each other when said elements are assembled, to form electrically parallel connected pressure contacts at the areas of contact on both sides of said magnetic field sensitive layer.

4. A magnetically controllable resistor as defined in claim 1, wherein each said element comprises a body having a form selected from the group consisting of plates and discs and said selected material has good electrical conductivity.

5. A magnetically controllable resistor as defined in claim 1 wherein each said element comprises a body having a form selected from the group consisting of plates and discs, said material is selected from the group consisting of poor electrical conductors and insulators, and each said element comprises a metal layer on the surfaces of each said body and on said structures.

6. A magnetically controllable resistor as defined in claim 1 wherein each said element comprises a body having a form selected from the group consisting of plates and discs and said selected material is a magnetically soft material having a high saturation field strength.

7. A magnetically controllable resistor as defined in claim 1 wherein said magnetic field sensitive layer comprises a material selected from the group consisting of bismuth, tellurium, III/V compounds and II/VI compounds.

8. A magnetically controllable resistor as defined in claim 1 wherein said magnetic field sensitive layer comprises superconductive material.

9. A magnetically controllable resistor as defined in claim 1 wherein both said elements are coated at least partially with a superconducting layer and said pressure contacts form Josephson point contact junctions between said superconducting layers.

10. A magnetically controllable variable resistor comprising a first element having at least three tapering elevations on one surface thereof, a second element having a surface cooperating with said one surface of said first element and a layer of a material with a specific electrical resistance which varies under the influence of a magnetic field, said layer of material being applied to at least one of said elements, being positioned between said first and second elements, and being connected with said first and second elements under mechanical pressure to provide pressure contacts in the region of said tapering elevations.

* * * * *